United States Patent [19]

Minato

[11] Patent Number: 4,692,996
[45] Date of Patent: Sep. 15, 1987

[54] METHOD OF FABRICATING SEMICONDUCTOR DEVICES IN DIELECTRICALLY ISOLATED SILICON ISLANDS

[75] Inventor: Yukio Minato, Tokyo, Japan

[73] Assignee: NEC Corporation, Tokyo, Japan

[21] Appl. No.: 800,257

[22] Filed: Nov. 21, 1985

[30] Foreign Application Priority Data

Nov. 21, 1984 [JP] Japan ................................ 59-246605

[51] Int. Cl.⁴ ..................... H01L 21/306; C03C 25/06
[52] U.S. Cl. ...................................... 437/73; 156/643; 156/648; 357/55
[58] Field of Search ............ 29/576 W, 576 E, 576 B, 29/571; 156/643, 648; 148/1.5, 187; 357/55

[56] References Cited

U.S. PATENT DOCUMENTS

| 4,373,252 | 2/1983 | Caldwell | 29/576 B |
| 4,502,913 | 3/1985 | Lechaton et al. | 156/643 |
| 4,561,932 | 12/1985 | Gris et al. | 29/576 W |
| 4,580,331 | 4/1986 | Soclof | 29/576 W |

Primary Examiner—Upendra Roy
Attorney, Agent, or Firm—Sughrue, Mion, Zinn, Macpeak, and Seas

[57] ABSTRACT

A semiconductor device comprising a semiconductor silicon substrate, a silicon oxide layer formed on the substrate, and at least one semiconductor device region formed within the silicon oxide layer, wherein the semiconductor device region is generally V-shaped in cross section with its reduced end directed toward the silicon substrate and its slanting opposite side surfaces isolated from the silicon substrate with the bulk of the silicon oxide layer.

5 Claims, 7 Drawing Figures

METHOD OF FABRICATING SEMICONDUCTOR DEVICES IN DIELECTRICALLY ISOLATED SILICON ISLANDS

FIELD OF THE INVENTION

The present invention relates to a semiconductor device such as a bipolar transistor or a semiconductor resistor and a method of fabricating such a semiconductor device.

BACKGROUND OF THE INVENTION

Of late, semiconductor integrated circuits are being scaled down while attempts are being made to speed up operation of the circuits semiconductor devices.

Speeding up semiconductor devices can be achieved by in two ways, one being to cause each of the individual semiconductor devices to operate quickly and the other being to of use higher current through the circuit. However use of higher current in a semiconductor integrated circuit is likely to lead to unwanted transistor saturation and the generation of heat. A result of these drawbacks to the use of higher current is a reduction in chip lifetime. Therefore, these are limitations to the level of current which can be used in semiconductor integrated circuits and, accordingly, the majority of the efforts for realizing faster device operation are toward speeding up the operation of individual devices of the semiconductor integrated circuit. There is, thus, a great demand for novel semiconductor devices which can operate quickly.

Additionally, device isolation for bipolar semiconductor devices is in most cases implemented by the formation of pn junctions, although oxide isolation methods are also used in limited quarters of the semiconductor industry. The oxide isolation methods use silicon oxide layers formed around the bipolar semiconductor devices. None of these attempts has successfully led to the development of a semiconductor device in which a silicon oxide layer extends to the bottom of the substrate. Examples of silicon oxide isolated bipolar semiconductor devices are described by Tetsu Fukano et al, in his publication "Ultra Steep Grooves Formed by Peripheral Etching and Application to Device Isolation" (Semiconductor Integrated Circuit Symp., December 1982). In one of the processes disclosed in this publication, molybdenum silicide ($MoSi_2$) is magnetron sputtered directly onto the surface of a silicon substrate to a thickness of about 0.3 microns. A patterned photoresist film (AZ-1350J) is placed on the resultant molybdenum silicide layer, which is then dry etched with a mixture of tetrachloromethane ($CCl_4$) and oxygen gases to form grooves in the molybdenum silicide layer and the underlying silicon substrate along the edges of the photoresist pattern. Upon removal of the photoresist film and the remnant molybdenum silicide layer from the silicon substrate, a silicon oxide layer is formed by thermal oxidation of the silicon substrate. Grooves which are thus formed in the silicon substrate by the "peripheral etching" technique terminate halfway into the bulk of the silicon substrate. As a result the individual regions separated by the silicon oxide layers formed in the peripheral etched grooves in the silicon substrate can not be reliably isolated from one another.

If the grooves in the silicon substrate are to be formed so as to extend to the bottom of the silicon substrate, so that the semiconductor devices to be formed in the regions defined by such grooves can be effectively isolated by the silicon oxide layers in the grooves, the individual semiconductor devices must be formed to protrude from the surface of the substrate in order to enable the bulk silicon to be oxidated toward the bottom of the substrate. The presence of such protrusions on the surface of the silicon results in the formation of steps in the metallic wiring layer which might cause the wiring layer to break at the steps during the processing which takes place after device fabrication.

For this reason conventional bipolar transistors have been isolated in using a pn junction between the device and the p-type silicon substrate. A problem with this technique is that a parasitic capacitance is created at the interface between the substrate and the collector of the device which makes it difficult to speed up device operation. It may also be mentioned that a channel stop region must be provided between neighboring device regions isolated according to the conventional technique. Provision of such additional regions on the substrate significantly limits integration density.

It is, accordingly, an important object of the present invention to provide an improved semiconductor device which can be effectively isolated by silicon oxide without impairing the performance quality of the device while providing a significantly reduced parasitic capacitance and a significantly increased isolation voltage.

It is another important object of the present invention to provide an improved isolated semiconductor device in a densely integrated integrated circuit structure.

It is still another important object of the present invention to provide an improved semiconductor device with internal wiring easily implemented.

It is still another important object of the present invention to provide an improved semiconductor device which can be easily handled during processing which takes place after fabrication of the semiconductor device.

It is, yet, still another important object of the present invention to provide a method of fabricating such an improved semiconductor device according to the present invention.

SUMMARY OF THE INVENTION

In accordance with one important aspect of the present invention, there is provided a semiconductor device comprising (1) a semiconductor silicon substrate, (2) a silicon oxide layer formed on the substrate, and (3) at least one semiconductor device region formed within the silicon oxide layer, the semiconductor device region being generally V-shaped in cross section with its reduced end directed toward the silicon substrate and its slanting opposite side surfaces isolated from the silicon substrate by the silicon oxide layer. If the semiconductor silicon substrate is of a first conductivity type, the semiconductor device region may have formed therein a collector layer of a second conductivity type, a base layer of the first conductivity type contacting the collector layer, and an emitter layer of the second conductivity type contacting the base layer. Alternatively, the semiconductor device region as a whole may be of a second conductivity type to form a resistor.

In accordance with another important aspect of the present invention, there is provided a method of fabricating a semiconductor device, comprising (1) preparing a semiconductor silicon substrate of a first conductivity, (2) forming a semiconductor layer of a second conductivity type on the substrate, (3) selectively removing the semiconductor layer to leave at least one protruding region reduced in size away from the the silicon substrate and protruding from the surface of the silicon substrate, (4) forming oxidation resistive layers on the top surface and a portion of each of the side surfaces of the protruding region, the oxidation resistive layer on the portion of each side surface merging with the oxidation resistive layer on the top surface, and (4) thermally oxidating portions of the silicon substrate and the protruding region to form a silicon oxide layer with at least one semiconductor device region formed within the silicon oxide layer, the semiconductor device region having a surface portion substantially flush with the surface of the silicon oxide layer. the

BRIEF DESCRIPTION OF THE DRAWINGS

The features and advantages of a semiconductor device according to the present invention and a method of fabricating such a semiconductor device will be more clearly appreciated from the following description taken in conjunction with the accompanying drawings in which like reference numerals designate similar elements and in which.

DESCRIPTION OF THE PREFERRED EMBODIMENTS

A preferred example of a semiconductor device fabrication method according to the present invention will now be explained with reference to FIGS. 1A to 1E.

Figure 1A:
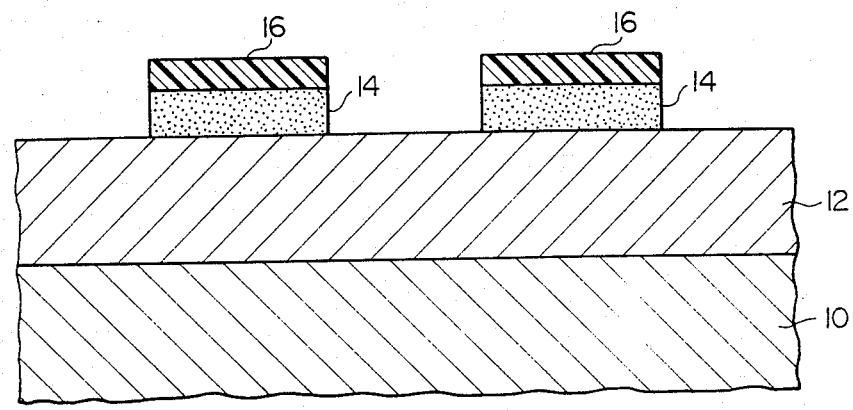
FIGS. 1A to 1E are cross sectional views showing the structures of a semiconductor device being fabricated by a method according to the present invention, FIG. 1E in particular showing the general constructive of a preferred embodiment of a semiconductor device according to the present invention.

Referring first to FIG. 1A, a method of fabricating an embodiment of a semiconductor device according to the present invention starts with the preparation of a p-type silicon substrate 10, typically of monosilicon. A lightly doped n-type layer 12 is epitaxially grown on the entire surface of the silicon substrate 10 in a reactive atmosphere of, for example, monosilane to a thickness of about 2 microns. A layer 14 of silicon nitride is grown on the surface of this n-type epitaxial layer 12 to a thickness of about 0.8 micron. The silicon nitride layer 14 thus formed on the epitaxial layer 12 is coated with a photoresist film. The photoresist film is then selectively exposed to radiation through a photomask (not shown) placed thereon and is thereafter developed to leave portions 16 thereof as indicated at 16. These remnant portions 16 of the photoresist film are then used as masks to cause the underlying silicon nitride layer 14 to be selectively dry etched to define device regions in the n-type epitaxial layer 12. The device regions thus defined may, for example, include a region for forming a bipolar transistor, a typical example of an active semiconductor device, and a region for forming a resistor, a typical example of a passive semiconductor device. The slice structure shown in FIG. 1A has resulted from this selective dry etching step upon removal of the photoresist portions 16.

Figure 1B:
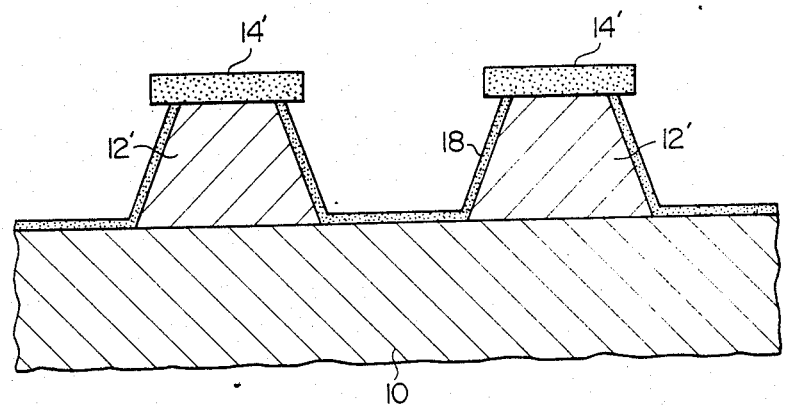

The remnant regions, now denoted by 14' in FIG. 1B, of the silicon nitride layer are then used as masks so that the epitaxial layer 12 can be selectively etched away to the surface of the silicon substrate 10, leaving n-type regions on and protruding from the surface of the silicon substrate 10 as indicated at 12' in FIG. 1B. It is, in this instance, of importance that the initial n-type epitaxial layer 12 be etched away so that the regions 12' of the layer to remain below the silicon nitride regions 14' respectively are reduced in size away from the exposed surface of the silicon substrate and are thus slightly offset at their upper ends inwardly from the bottom edges of the silicon nitride regions 14'. The silicon nitride regions 14' are then wet etched to remove a side marginal portion of each of the regions 14' to reduce the width of each region 14' by about 0.4 microns. Subsequently, a thin film 18 of silicon nitride is grown to a thickness of about 500 Å on the exposed areas of the silicon substrate 10 and the side faces of the n-type epitaxial regions 12' as shown in FIG. 1B. Each of the silicon nitride regions 14' of the resultant structure has overhangs over the film of the silicon nitride regions 18.

Figure 1C:
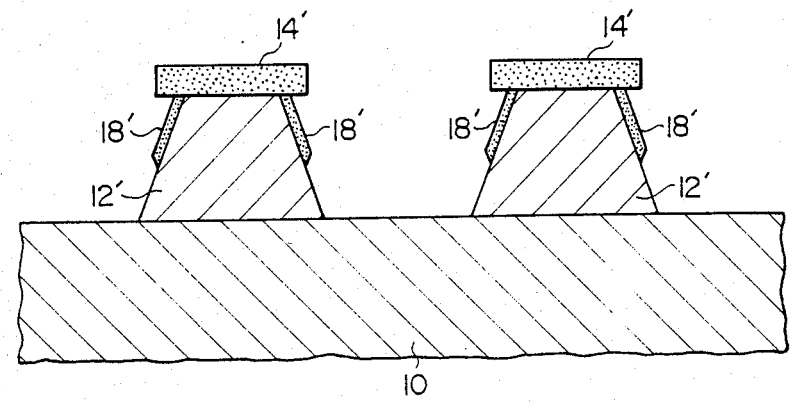

The silicon nitride regions 14' having such overhangs are now used as masks as the additional silicon nitride film 18 is anisotropically etched to leave upper portions thereof below the overhangs of the silicon nitride regions 14' as indicated at 18' in FIG. 1C. Each of the remnant portions 18' thus formed of the silicon nitride film 18 upwardly terminates at the bottom face of each of the silicon nitride regions 14' and is short of the exposed surface of the silicon substrate 10, allowing each n-type epitaxial region 12' to be exposed immediately above the surface of the substrate 10 as shown. The measurements of the respective overhangs of the silicon nitride regions 14' and the reduction in size of the n-type epitaxial region 12' away from the surface of the silicon substrate 10 are preferably selected in dependence on the desired measurements of these portions 18' of the silicon nitride film.

The silicon substrate 10 and the n-type epitaxial regions 12' are then thermally oxidated at about 950° C. The silicon nitride regions 14' and 18' on the n-type epitaxial regions 12' are used as oxidation resistive layers during this thermal oxidation process. The thermal oxidation proceeds into the silicon substrate 10 and the epitaxial regions 12' at those portions of the silicon substrate 10 and the regions 12' which are not covered with the silicon nitride regions 14' and 18' serving as masking layers. The thermal oxidation step is terminated when the bulk silicon initially forming part of the silicon substrate 10 and the n-type epitaxial regions 12' is converted into a unitary silicon oxide layer 20 with each of the regions 12' remaining in the form of an island having a generally V-shaped or parabolic cross section in a plane normal to the surface of the initial silicon substrate 10 with its reduced end directed toward the silicon substrate, as indicated at 22 and 22' in FIG. 1D. Each of the semiconductor device regions 22 and 22' thus formed within the silicon oxide layer 20 has its slanting opposite side surfaces isolated from the silicon substrate 10 with the bulk of the silicon oxide layer 20. The interface between the silicon oxide layer 20 and each of the n-type semiconductor device regions 22 and 22' lies on an extremely smooth curved plane as will be seen from FIG. 1D. Furthermore, each of the semiconductor device regions 22 and 22' has an outer surface portion substantially flush with the surface of the silicon oxide layer 20.

Figure 1D:
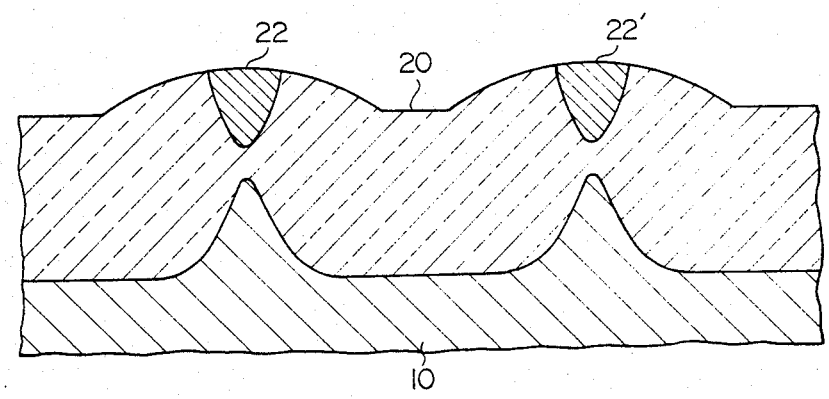
Figure 1E:
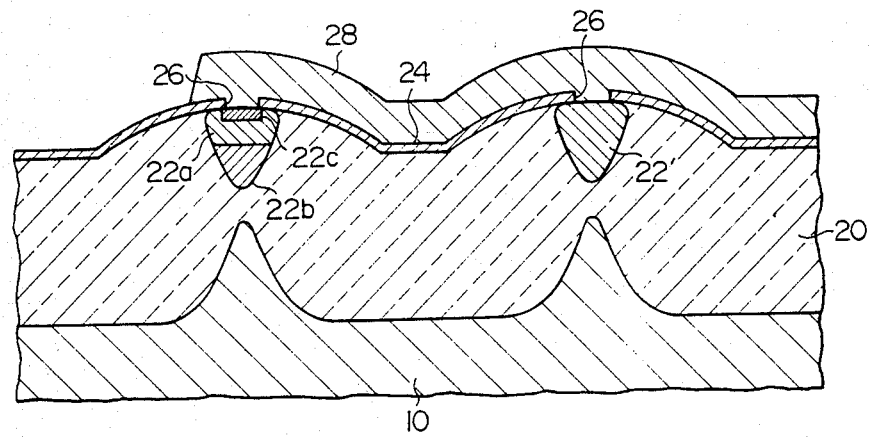

In the present example of the method according to the present invention, one n-type semiconductor device region 22 is to be used for the formation of a bipolar transistor and the other is to be used as a resistor. To form a bipolar transistor in the device region 22, a p-type dopant is injected into the region 22 to form a p-type layer 22a on a layer 22b forming part of the initial n-type semiconductor device region 22 as shown in FIG. 1E. Into this p-type layer 22a is further injected or diffused an n-type dopant to form a heavily doped n+-type top layer 22c on the intermediate layer 22a. A bipolar transistor is thus provided which consists of a base implemented by the intermediate p-type layer 22a, a collector implemented by the lowermost lightly doped n-type layer 22b resulting from the initial n-type epitaxial region 12' (FIG. 1C), and an emitter implemented by the uppermost heavily doped n+-type layer 22c. The N+-type emitter layer 22c has an outer surface portion substantially flush with the surface of the silicon oxide layer 20. The bipolar transistor constructed in this fashion has a the collector region implemented by the lightly doped n-type layer 22b which is generally wedge-shaped in cross section as will be clearly seen from FIG. 1E. This provides a uniplanar p-n junction between the collector and base regions of the transistor and a smaller cross sectional area of the collector region than the cross sectional area of the base region implemented by the heavily doped n+-type layer 22c. Such a transistor permits significant reduction in the capacitance at the interface between the p-type silicon substrate 10 and the collector forming n-type layer 22b and in the capacitance at the interface between the base-forming p-type layer 22a and the collector-forming n-type layer 22b. An n+-type dopant may be diffused into the initial n-type semiconductor device region 22 before the thermal oxidation process is to be carried out, thus reducing the resistance of the n-type layer 22b forming the collector. On the other hand, the other n-type semiconductor device region 22' shown in FIG. 1D is left as it is to serve as a resistor. If desired, a controlled dosage of a p⁻-type dopant may be introduced into the n-type semiconductor device region 22' after the thermal oxidation of the region to provide a desired resistivity.

Figure 2A:
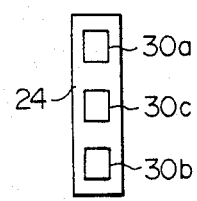
FIG. 2A is a schematic plan view showing the general configuration of a bipolar transistor forming part of a semiconductor device embodying the present invention.
Figure 2B:
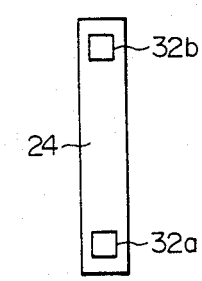
FIG. 2B is a view similar to FIG. 2A but shows the general configuration of a resistor forming part of a semiconductor device embodying the present invention.

The doped layers 22a, 22b and 22c are appropriately patterned to have exposed surfaces preferably on a common plane though not shown in the drawings. A silicon oxide film 24 is formed on the entire surface of the resultant structure by, for example, a CVD process or by sputtering and then selectively etched away to form respective openings exposing portions of the layers 22a, 22b and 22c of the transistor and the n-type region 22' forming the resistor. A patterned film 28 of metal such as aluminum is then formed by, for example, deposition, on the silicon oxide film 24 to provide electrical connections between the individual semiconductor devices on the slice structure. Thus, the bipolar transistor formed by the layers 22a, 22b and 22c has an electrode pattern which includes a base electrode 30a, a collector electrode 30b and an emitter electrode 30c isolated from one another by means of the silicon oxide film 24 as schematically shown in FIG. 2A. Likewise, the resistor formed by the n-type region 22' has an electrode pattern which includes electrodes 32a and 32b isolated from each other by the silicon oxide film 24 as schematically shown in FIG. 2B. If it is desired to provide an electrode for the silicon substrate 10, it will be advantageous to form the associated silicon nitride region 14 or 14' over an increased area. The smoothly curved interface between the silicon oxide layer 20 and each of the transistor and resistor regions as provided by the present invention will make it easy to perform the wiring with the patterned metal film 28.

As will have been appreciated from the foregoing description, a semiconductor device proposed by the present invention can be assuredly isolated by silicon oxide without impairing the performance quality of the device while providing a significantly reduced parasitic capacitance and a significantly increased isolation voltage. Provision of a plurality of such semiconductor devices in a semiconductor integrated circuit structure will give rise to an increase in the integration density of the circuit structure since the individual semiconductor devices forming the circuit structure are isolated from one another by a single layer of silicon oxide. Furthermore, because of the fact that the internal wiring for a semiconductor device according to the present invention can be effected with ease due to the formation of a smoothly curved interface between the silicon oxide layer and each of the transistor and resistor regions as above noted, the semiconductor device can be handled with ease during the subsequent process steps.

What is claimed is:

1. A method of fabricating a semiconductor device, comprising
   (1) preparing a semiconductor substrate of a first conductivity,
   (2) forming a semiconductor layer of a second conductivity type on the substrate,
   (3) selectively removing the semiconductor layer to leave at least one protruding region gradually reduced in cross section away from said substrate and protruding from the surface of the substrate,
   (4) forming oxidation resistive layers on the top surface and a portion of each of the side surfaces of said protruding region, the oxidation resistive layer on said top surface partially overhanging the top surface of said protruding region and the oxidation resistive layer on said portion of each side surface merging with the oxidation resistive layer on said top surface and terminating ahead of the exposed surface of the substrate to allow said semiconductor layer to be exposed adjacent the exposed surface of the substrate, and
   (5) thermally oxidating exposed portions of said substrate and said protruding region to form a silicon oxide layer with at least one semiconductor device region formed within the silicon oxide layer, said semiconductor device region having a surface portion substantially flush with the surface of said silicon oxide layer.

2. A method of fabricating a semiconductor device as set forth in claim 1, in which said oxidation resistive layer on said portion of each of the side surfaces of said protruding region is formed by forming such a layer on the total area of each side surface of said protruding region and on the exposed portions of the surface of the substrate and thereafter removing a portion of said oxidation resistive layer from the surface of the substrate and a portion of each side surface of said protruding region adjacent the surface of said substrate.

3. A method of fabricating semiconductor device as set forth in claim 1, in which said semiconductor device region is generally V-shaped in cross section with its reduced end directed toward said substrate and its slanting opposite side surfaces isolated from the substrate with the bulk of said silicon oxide layer, and in which said semiconductor substrate is of a first conductivity type and said semiconductor device region is of a second conductivity type, wherein the method further comprises doping one portion of said semiconductor device region for forming a base layer of said first conductivity type and doping another portion of the semiconductor device region for forming an emitter layer of said second conductivity type contacting said base layer, the remaining portion of said semiconductor device region forming a collector layer of said second conductivity type contacting said base layer.

4. A method of fabricating semiconductor device as set forth in claim 1, 2, or 3, in which said semiconductor device region is doped with a dopant of said second conductivity type prior to the thermal oxidation of the region.

5. A method of fabricating semiconductor device as set forth in claim 1, 2, or 3, in which said semiconductor device region is doped with a dopant of said second conductivity type after the thermal oxidation of the region.

* * * * *

UNITED STATES PATENT AND TRADEMARK OFFICE
CERTIFICATE OF CORRECTION

PATENT NO. : 4,692,996

DATED : September 15, 1987

INVENTOR(S) : MINATO

It is certified that error appears in the above-identified patent and that said Letters Patent is hereby corrected as shown below:

COLUMN 1, LINE 19  After "other being to" delete "of".

COLUMN 2, LINE 31  After "densely" delete "integrated"

COLUMN 3, LINE 15  After "layer." delete "The"

COLUMN 4, LINE 24  After "nitride" insert --film--.

COLUMN 6, CLAIM 3, LINE 2  After "as set forth in", delete "Claim 1", insert --Claim 2--.

Signed and Sealed this

Nineteenth Day of July, 1988

Attest:

DONALD J. QUIGG

Attesting Officer     Commissioner of Patents and Trademarks